(12) United States Patent
Patti

(10) Patent No.: US 6,548,863 B2
(45) Date of Patent: Apr. 15, 2003

(54) LATERAL DMOS TRANSISTOR INTEGRATABLE IN SEMICONDUCTOR POWER DEVICES

(75) Inventor: Davide Patti, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/973,960

(22) Filed: Oct. 9, 2001

(65) Prior Publication Data

US 2002/0063260 A1 May 30, 2002

(30) Foreign Application Priority Data

Oct. 11, 2000 (EP) .............................................. 00830661

(51) Int. Cl.[7] ............................................. H01L 31/113
(52) U.S. Cl. .......................... 257/335; 257/341; 257/401
(58) Field of Search ............................... 257/335, 341, 257/401, 500, 501, 502, 578; 438/197, 284, 286, 370, 394

(56) References Cited

U.S. PATENT DOCUMENTS 4,796,070 A    1/1989   Black ........................ 357/23.4
5,349,224 A  * 9/1994   Gilbert et al. ............... 257/333
5,569,949 A  * 10/1996  Malhi .......................... 257/397

FOREIGN PATENT DOCUMENTS

JP             11103056         4/1999

OTHER PUBLICATIONS

Zitouni et al., "A New Concept for the Lateral DMOS Transistor for Smart Power IC's," IEEE: 73–76, 1999.

* cited by examiner

Primary Examiner—David Nelms
Assistant Examiner—Long Tran
(74) Attorney, Agent, or Firm—Lisa K. Jorgenson; Harold H. Bennett, II; Seed IP Law Group PLLC

(57) ABSTRACT

The lateral DMOS transistor is integratable in a semiconductor power device comprising a P-type substrate and an N-type epitaxial layer. The lateral DMOS transistor comprises a source region and a drain region formed in the epitaxial layer and a body region housing the source region. Between the source region and the drain region is present an insulating region extending in depth from a top surface of the epitaxial layer as far as the substrate. The insulating region presents an interruption in a longitudinal direction defining a channeling region for a current $I_D$ flowing between the source region and the drain region of the lateral DMOS transistor.

20 Claims, 5 Drawing Sheets

LATERAL DMOS TRANSISTOR INTEGRATABLE IN SEMICONDUCTOR POWER DEVICES

BACKGROUND OF THE INVENTION

1. Field of the Invention

The present invention regards a lateral DMOS transistor integratable in semiconductor power devices.

2. Description of the Related Art

As is known, lateral DMOS transistors are extensively used in semiconductor power devices on account of the ease with which they may be connected to the other components making up the device and on account of their low resistance.

One of the major problems encountered in the fabrication of lateral DMOS transistors is represented by the fact that high electrical fields are set up on their surfaces, for example in the vicinity of their gate regions, which may cause early breakdown of said transistors.

To reduce the surface electrical fields various solutions have been proposed. Among these, a technique currently used is illustrated in M. Zitouni, F. Morancho, P. Rossel, H. Tranduc, J. Buxo, and I. Pagès, "A New Concept for the Lateral DMOS Transistor for Smart Power IC's", Proceedings of ISPSD 99, Toronto, Ontario, Canada, May 26–28. This technique envisages the formation, in the epitaxial layer housing the body and drain regions of the lateral DMOS transistor, beneath the gate region, of an insulating region having a U-shaped cross section, which is filled with oxide. The insulating region may extend in depth as far as approximately one half of the thickness of the epitaxial layer. In such conditions, the equipotential lines of the surface electrical field remain confined within the insulating region, and the charge-depletion region surrounding the junction made up of the body region and the epitaxial region does not extend very far in the direction of the drain region. This enables high breakdown voltages (up to 69 V) to be achieved with reduced dimensions. However, in certain applications higher performance levels are required, with higher breakdown voltages given the same dimensions, or else smaller dimensions given the same breakdown voltages.

SUMMARY OF THE INVENTION

An embodiment of the present invention is to provides a lateral DMOS transistor that will improve the performance levels that are obtainable from known transistors.

The lateral DMOS transistor is integratable in semiconductor power devices, and includes a P-type substrate and an N-type epitaxial layer. The lateral DMOS transistor comprises a source region and a drain region formed in the epitaxial layer and a body region housing the source region. Between the source region and the drain region is present an insulating region extending in depth from a top surface of the epitaxial layer as far as the substrate. The insulating region presents an interruption in a longitudinal direction defining a channeling region for a current $I_D$ flowing between the source region and the drain region of the lateral DMOS transistor.

BRIEF DESCRIPTION OF THE DRAWINGS

The characteristics and advantages of the lateral DMOS transistor according to the present invention will emerge from the ensuing description of two embodiments thereof, which are provided purely to furnish non-limiting examples, with reference to the attached drawings, in which.

DETAILED DESCRIPTION OF THE INVENTION

Figure 1:
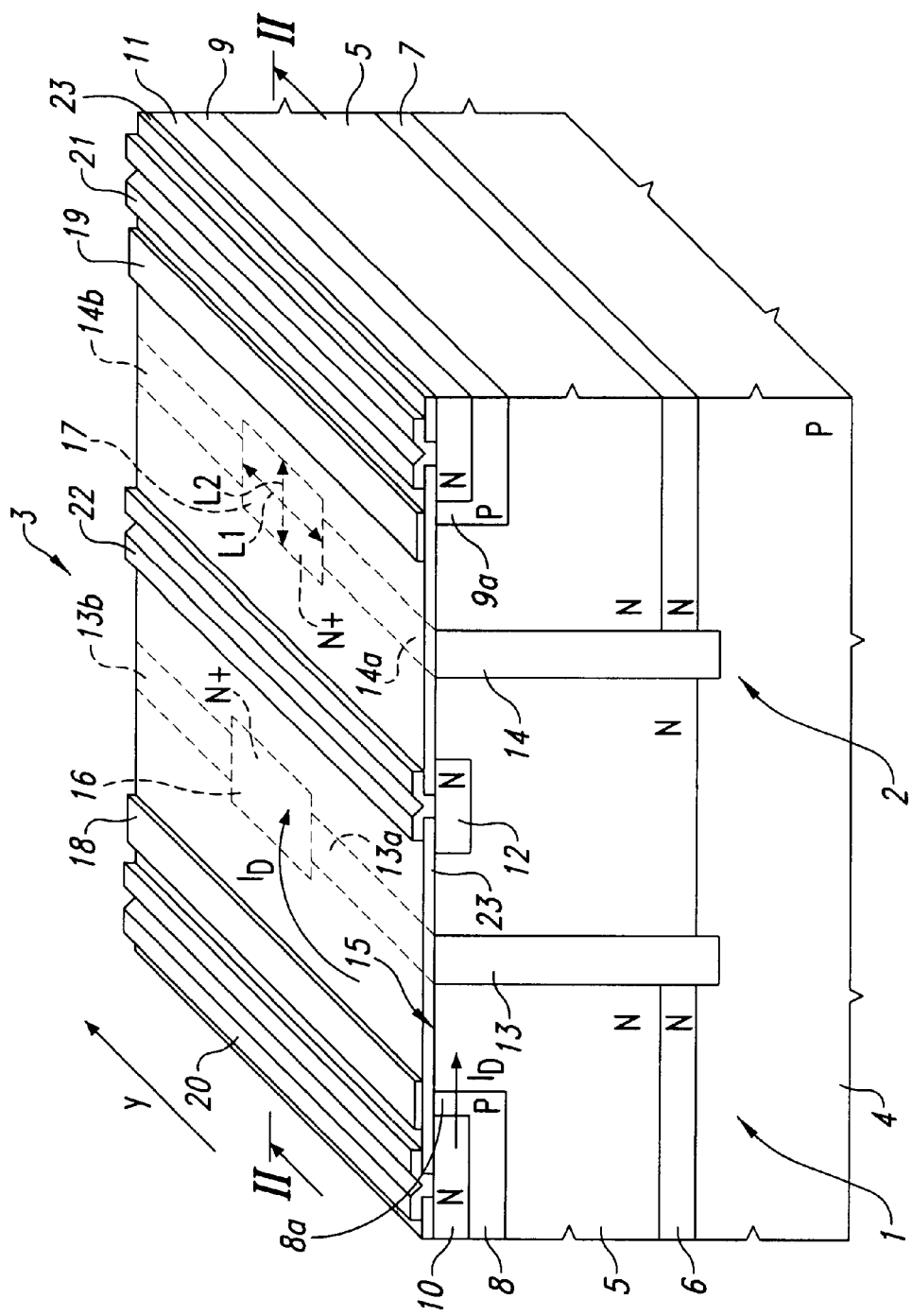
FIG. 1 is a perspective view of a semiconductor power device incorporating lateral DMOS transistors made according to a first embodiment of the invention.

FIG. 1 shows a first embodiment of a first lateral DMOS transistor 1 and a second lateral DMOS transistor 2 incorporated in a semiconductor power device 3. The power device 3 comprises a strongly doped P-type substrate 4 and an N-type epitaxial layer 5 grown on top of the substrate 4. The epitaxial layer 5 has a concentration and thickness that are appropriately calibrated according to the voltage at which the power device 3 is to operate.

Each lateral DMOS transistor 1, 2 comprises: an N-type buried region 6, 7 doped with arsenic or antimony; a P-type body region 8, 9 housed in the epitaxial layer 5 above the respective buried region 6, 7 and at a distance from the latter; and an N-type source region 10, 11 housed inside the respective body region 8, 9. In addition, the epitaxial layer 5 houses an N-type common drain region 12 which is shared between both of the lateral DMOS transistors 1, 2. The common drain region 12 is moreover set between the body regions 8, 9 of the lateral DMOS transistors 1, 2. The buried regions 6, 7, the body regions 8, 9, the source regions 10, 11, and the common drain region 12 are all made using known techniques of ion-implantation photolithography.

Each lateral DMOS transistor 1, 2 also comprises an insulating region 13, 14 set between the respective body region 8, 9 and the common drain region 12. The insulating region 13, 14 is made using known photolithography techniques and selective chemical etching so as to form a trench, and is filled with insulating material (for example, pyrolithic silicon dioxide $SiO_2$), using known processing techniques. Each insulating region 13, 14 extends in depth from a top surface 15 of the epitaxial layer 5 as far as the substrate 4. The insulating region 13 laterally delimits the buried region 6, whilst the insulating region 14 laterally delimits the buried region 7. Furthermore, the insulating regions 13, 14 delimit, between them, a portion of the epitaxial layer 5 in which the common drain region 12 is set.

Figure 2:
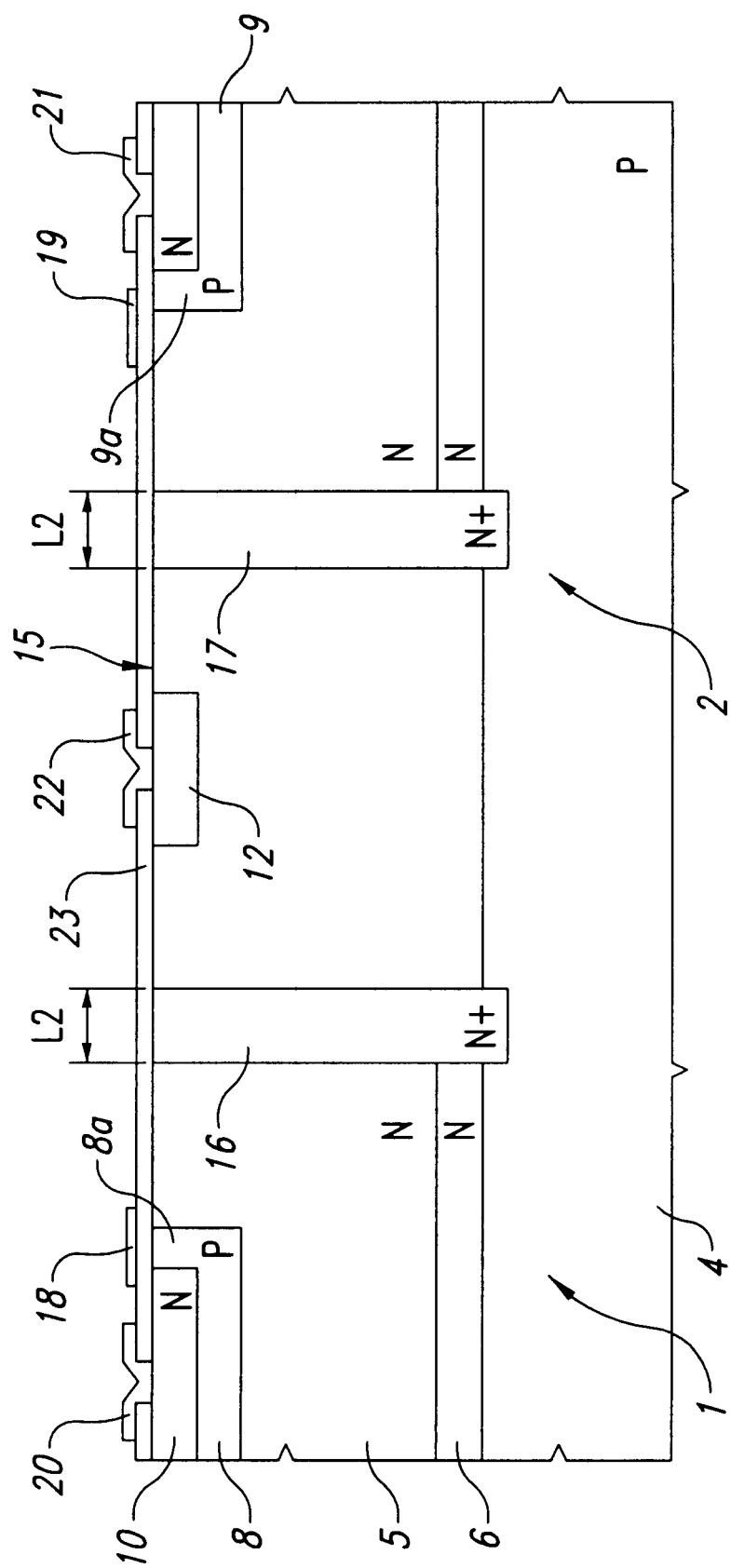
FIG. 2 shows a cross section, taken along the line II—II of FIG. 1, of the semiconductor power device.
Figure 3:
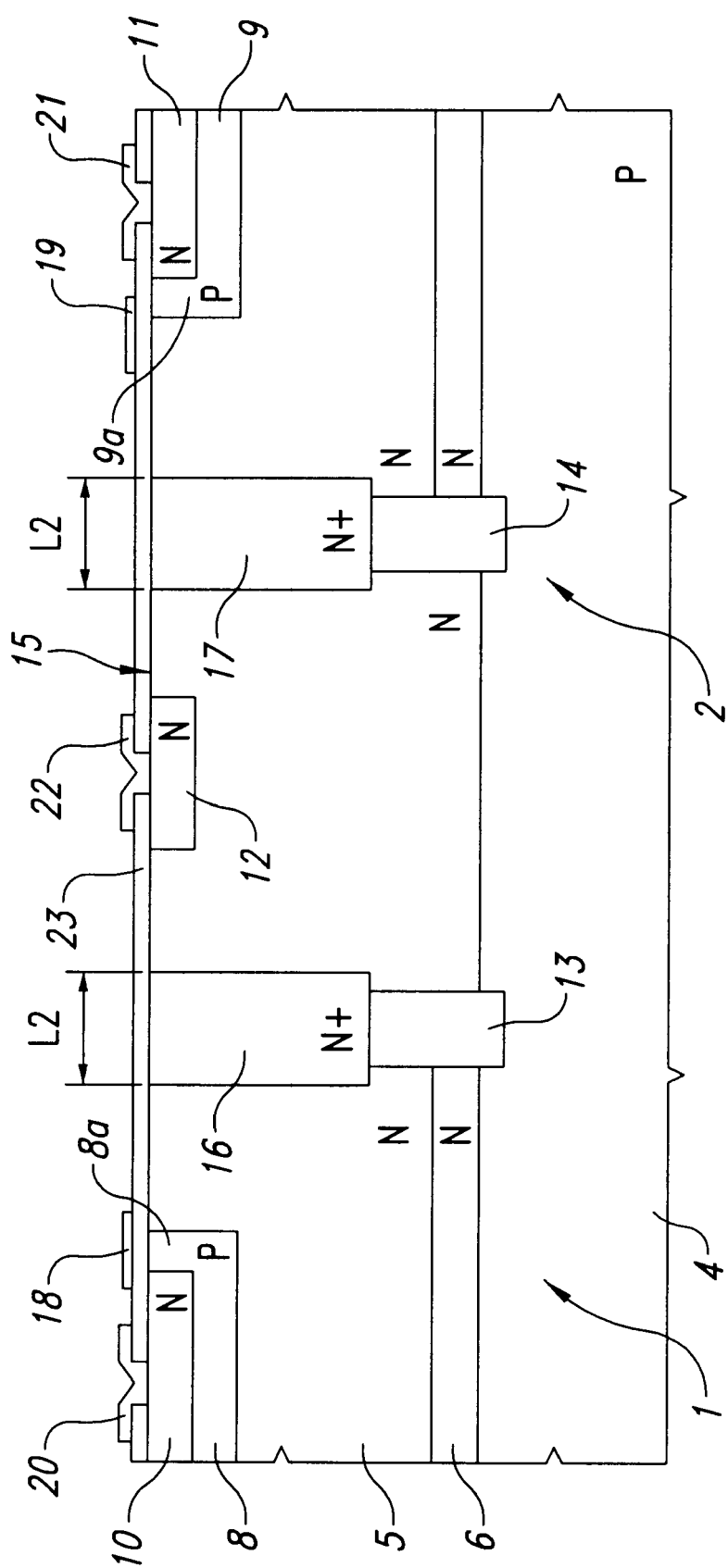
FIG. 3 shows the cross section of FIG. 2 according to a different embodiment of a portion of the semiconductor device.

Each insulating region 13, 14 is interrupted along a longitudinal direction Y in such a way as to define a first portion 13a, 14a and a second portion 13b, 14b of the insulating regions 13, 14. The portions 13a, 13b and 14a, 14b are mutually aligned and separated by a respective separating region 16, 17 extending in depth as far as the substrate 4 (FIG. 2). Alternatively, each separating region 16, 17 may have a smaller depth than the epitaxial layer 5 (FIG. 3). The separating regions 16, 17 have a higher level of doping than the epitaxial layer 5 and have a length $L_1$ in the longitudinal direction Y such as to enable passage of a current $I_D$ between the source regions 10, 11 and the common drain region 12 when the lateral DMOS transistors are turned on. Consequently, the separating regions 16, 17 define flow-channeling regions for the lateral DMOS transistors 1, 2. In fact, unlike what happens in known lateral DMOS transistors, in the lateral DMOS transistors 1, 2 according to the invention the current cannot pass underneath the insulating regions 13, 14 in that the junction made up of the substrate 4 and the epitaxial layer 5 is reverse-biased.

In addition, by appropriately selecting the width $L_2$ and the level of doping of the separating regions 16, 17, it is possible to obtain that, in conditions of turning-off of the lateral DMOS transistors 1, 2, the charge-depletion regions that surround the junctions made up of the body regions 8, 9 and the epitaxial layer 5 (and hence the equipotential lines of the electrical field present in said regions) do not extend beyond the insulating regions 13, 14, also in view of the fact that the insulating regions 13, 14 reach the substrate 4.

Above the top surface 15, previously subjected to planarization by means of chemical etching or a CMP process, of the epitaxial layer 5 there is present a thermally grown gate oxide layer 23. The gate oxide layer 23 has a thickness such as to be able to withstand the threshold voltage at which it is intended that the lateral DMOS transistors 1, 2 should operate. On top of the gate oxide layer 23 there is present a polycrystalline-silicon film (not shown for reasons of simplicity) formed by deposition and doped in situ or else formed by ion implantation.

Each lateral DMOS transistor 1, 2 also comprises: gate contact regions 18, 19 formed on top of the polycrystalline-silicon film; source contact regions 20, 21 formed on top of the source region 10, 11; and a drain contact common region 22 formed on top of the common drain region 12. The gate contact regions 18, 19 extend in the longitudinal direction Y, above a portion 8a, 9a of the body region 8, 9 facing the top surface 15 of the epitaxial layer 5, and are set facing the common drain region 12. In addition, the gate contact regions 18, 19 slightly overlap the respective source regions 10, 11 and are made by means of photolithography and chemical etching. The source contact regions 10, 11 and the drain contact common region 22 also extent in the longitudinal direction Y and are made employing known photolithography and deposition techniques.

Figure 4:
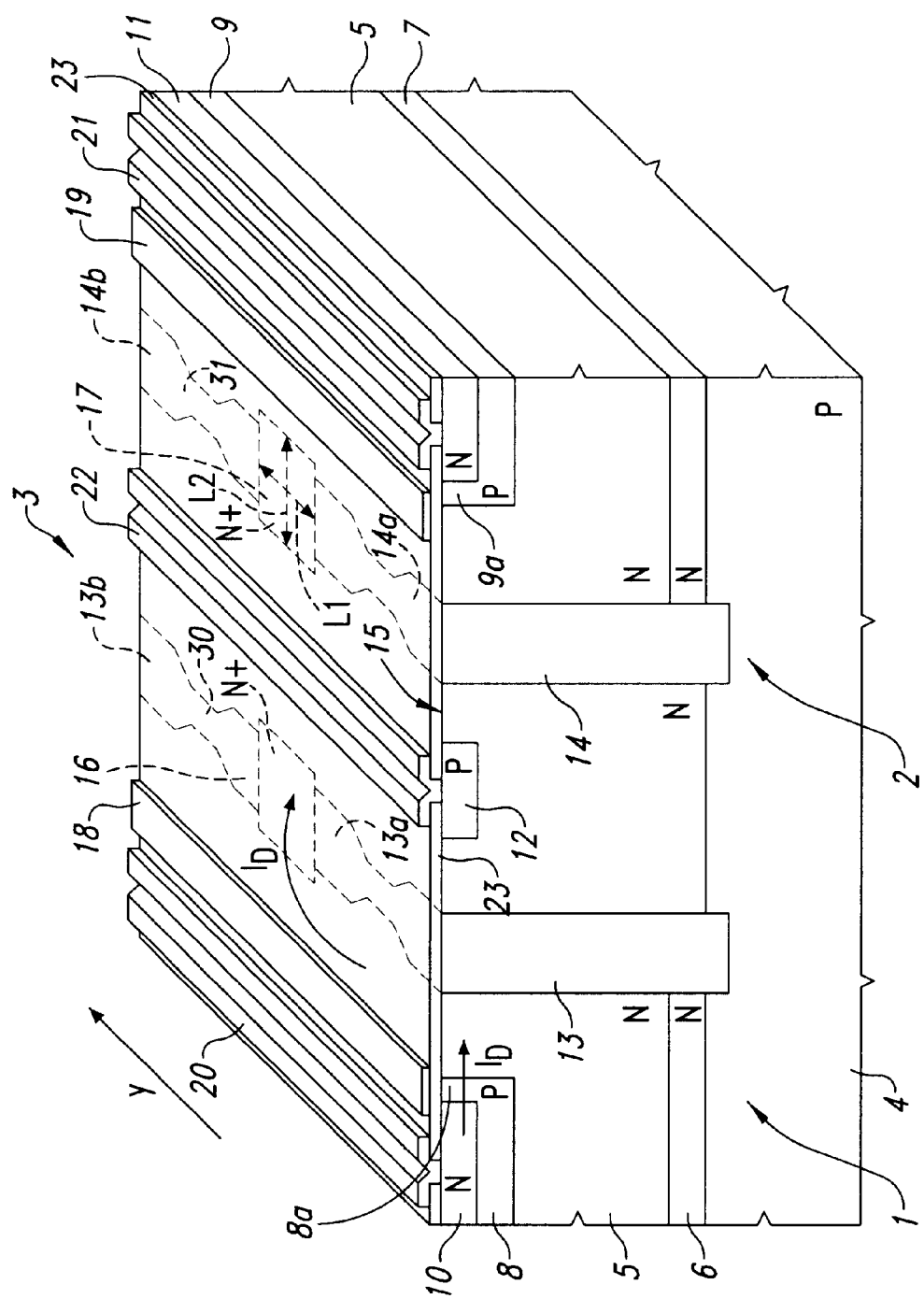
FIG. 4 is a perspective view of the semiconductor power device of FIG. 1 incorporating lateral DMOS transistors made according to a second embodiment of the invention.

FIG. 4 shows a second embodiment of the first lateral DMOS transistor 1 and second lateral DMOS transistor 2, in which the first portions 13a, 14a and second portions 13b, 14b of each insulating region 13, 14 present edge areas with widened sections. In this way, there is a decrease in the electrical field present in the edge areas of each portion 13a, 14a and 13b, 14b.

The advantages that may be obtained with the lateral DMOS transistors described herein are illustrated in what follows. In the first place, given the same breakdown voltage, the lateral DMOS transistors according to the invention present a surface having dimensions smaller than those of known lateral DMOS transistors. In fact, in the lateral DMOS transistors according to the invention, the charge-depletion regions are entirely contained within the insulating regions 13, 14. In this way, the common drain region 12 can be formed at a smaller distance from the source regions 10, 11, thus minimizing the overall dimensions. On the other hand, it has been experimentally verified that, given the same overall surface, the lateral DMOS transistors according to the invention present a breakdown voltage higher (over 70 V) than that of known lateral DMOS transistors.

Finally, it is clear that numerous variations and modifications may be made to the lateral DMOS transistors described and illustrated herein, all falling within the scope of the inventive idea as defined in the attached claims. For example, each insulating region 13, 14 may have more than one interruption in the longitudinal direction Y.

Figure 5:
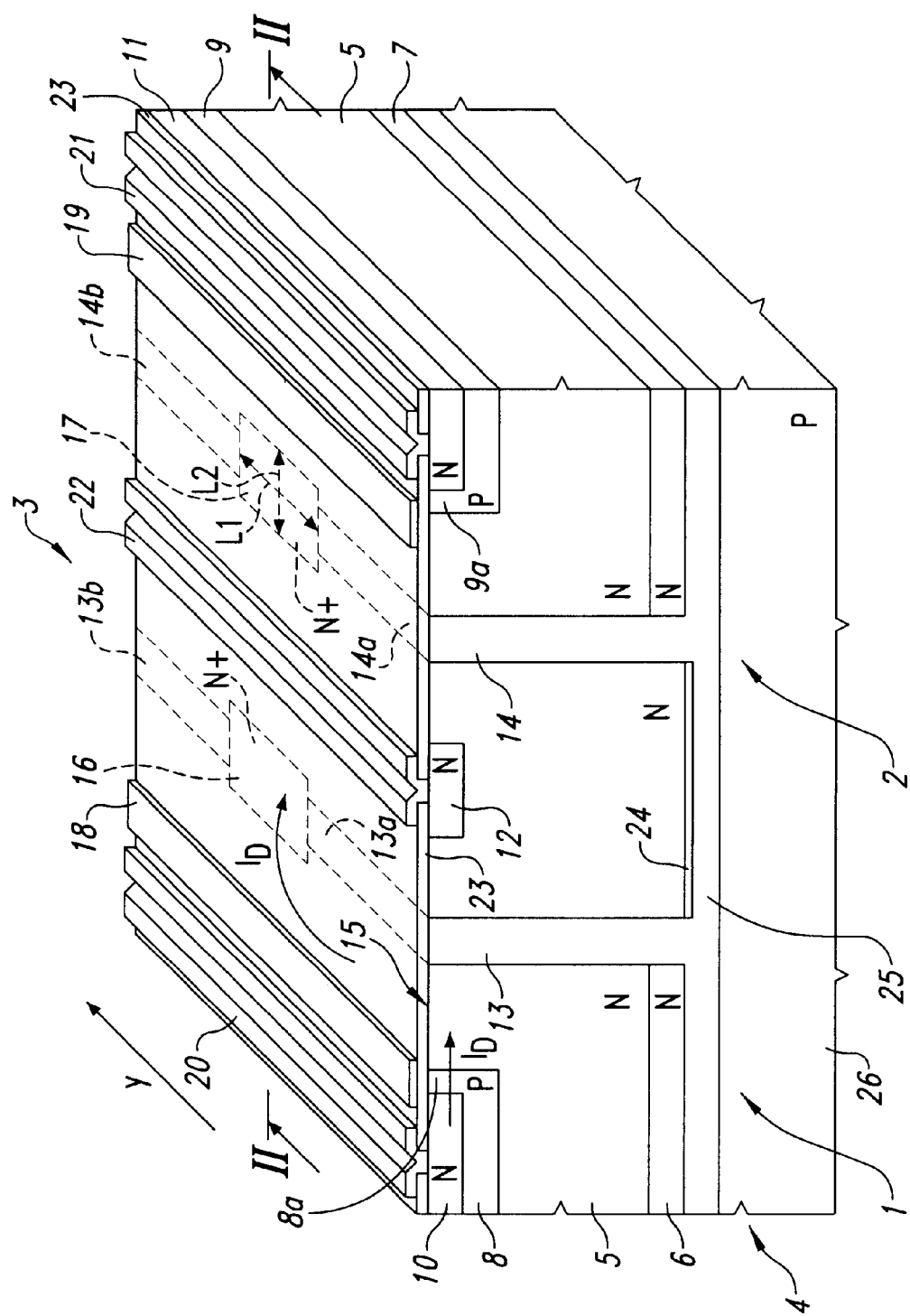
FIG. 5 is a perspective view of the semiconductor power device of FIG. 1 according to a different embodiment.

In addition, the substrate 4 may advantageously be of the silicon-on-insulator (SOI) type, namely be made up of a first silicon layer 24, a silicon-dioxide layer 25, and a second silicon layer 26 stacked on top of one another. In this case, the trenches 13, 14 extend in depth as far as the silicon-dioxide layer 25 (FIG. 5).

I claim:

1. A power device comprising:
    a first semiconductor region having a first type of conductivity;
    a second semiconductor region having a second type of conductivity and being set on top of said first semiconductor region; and
    a lateral DMOS transistor formed in said second semiconductor region, said lateral DMOS transistor comprising:
        first and second conduction regions formed in said second semiconductor region;
        a body region surrounding one of said first and second conduction regions;
        an insulating region formed in said second semiconductor region between said first and second conduction regions, extending in depth from a top surface of said second semiconductor region as far as said first semiconductor region, said insulating region presenting at least one interruption defining a channeling region for charge carriers flowing between said first and second conduction regions.

2. A power device according to claim 1, wherein said insulating region comprises a first portion and a second portion which are mutually aligned and are set at a distance apart along a pre-set direction.

3. A power device according to claim 2, wherein said first portion (13a, 14a) and said second portion have a constant cross section.

4. A power device according to claim 2, wherein, said first portion and said second portion comprise edge areas having a widened section.

5. A power device according to claim 2, wherein said channeling region has a length equal to the distance between said first portion and said second portion of said insulating region.

6. A power device according to claim 1, wherein said channeling region has said second type of conductivity and a doping level higher than that of said second semiconductor region.

7. A power device according to claim 1, wherein said channeling region has a variable depth.

8. A power device according to claim 1, wherein said first semiconductor region defines a substrate of said power device, and said second semiconductor region defines an epitaxial layer of said power device.

9. A power device according to claim 8, wherein said substrate is of the SOI type and comprises a silicon-dioxide layer, and said insulating region extends in depth from the top surface of said second semiconductor region as far as said silicon-dioxide layer.

10. A power device according to claim 1, wherein said first type of conductivity is P and said second type of conductivity is N.

11. A device comprising:
    a semiconductor substrate having a first type of conductivity;

a layer of semiconductor material on the substrate, having a second type of conductivity;

a body region having the first type of conductivity, formed in the layer;

a first conduction region having the second type of conductivity, formed in the body region;

a second conduction region having the second type of conductivity, formed in the layer;

an insulating region formed in the layer between the body region and the second conduction region, the insulating region having an interruption; and a channeling region positioned in the interruption and structured to allow conduction when the device is activated.

12. The device of claim 11, further comprising:

an insulating layer formed on the upper surface of the layer of semiconductor material;

a source contact region formed on the insulating layer above the first conduction region and in contact therewith through a first opening in the insulating layer;

a drain contact region formed on the insulating layer above the second conduction region and in contact therewith through a second opening in the insulating layer; and a gate contact region formed on the insulating layer above a portion of the body region.

13. The device of claim 12, wherein the device is a lateral DMOS transistor.

14. The device of claim 11, wherein the channeling region has a higher doping level than the layer of semiconductor material.

15. The device of claim 11, wherein the channeling region extends from the upper surface of the layer of semiconductor material to the semiconductor substrate.

16. The device of claim 11, further comprising a lower insulating layer, formed between the semiconductor substrate and the layer of semiconductor material.

17. The device of claim 11, further comprising a gate contact positioned over the body region, wherein the entire insulating region is spaced laterally from the gate contact such that no portion of the insulating region underlies the gate contact.

18. The device of claim 11, wherein the channeling region is one of a plurality of channeling regions defined by interruptions in the insulating region.

19. A device comprising:

a semiconductor substrate having a first type of conductivity;

a layer of semiconductor material on the substrate, having a second type of conductivity;

first and second body regions having the first type of conductivity, formed in the layer;

first and second source conduction region having the second type of conductivity, formed in the first and second body regions, respectively;

a common drain conduction region having the second type of conductivity, formed in the layer between and removed from the body regions; and first and second insulating regions, formed in the layer between the first body region and the common drain conduction region and the second body region and the common drain conduction region, respectively, and extending from an upper surface of the layer to the substrate, the first and second insulating regions each having an interruption defining a channeling region.

20. The device of claim 19, wherein the device is a pair of lateral DMOS transistors.

* * * * *